United States Patent
Xiang et al.

(10) Patent No.: US 10,020,466 B2
(45) Date of Patent: Jul. 10, 2018

(54) FLEXIBLE MULTILAYER SCATTERING SUBSTRATE USED IN OLED

(71) Applicant: Universal Display Corporation, Ewing, NJ (US)

(72) Inventors: Chaoyu Xiang, Ewing, NJ (US); Ruiqing Ma, Ewing, NJ (US); Renata Saramak, Ewing, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 15/873,193

(22) Filed: Jan. 17, 2018

(65) Prior Publication Data

US 2018/0159079 A1    Jun. 7, 2018

Related U.S. Application Data

(63) Continuation of application No. 15/200,596, filed on Jul. 1, 2016, now Pat. No. 9,899,631.

(60) Provisional application No. 62/189,961, filed on Jul. 8, 2015.

(51) Int. Cl.
*H01L 51/52* (2006.01)
*H01L 51/00* (2006.01)

(52) U.S. Cl.
CPC ...... *H01L 51/5268* (2013.01); *H01L 51/0097* (2013.01); *H01L 51/5256* (2013.01)

(58) Field of Classification Search
CPC ............. H01L 51/0096; H01L 51/5203; H01L 51/5262; H01L 51/5265; H01L 51/5268; H01L 51/5281; H01L 2251/558; H01L 27/3211; H01L 27/322; H01L 51/0097; H01L 51/5256; H01L 51/5275

USPC .................... 438/82, 99; 257/40, 79
See application file for complete search history.

(56) References Cited

U.S. PATENT DOCUMENTS

| | | | |
|---|---|---|---|
| 4,769,292 | A | 9/1988 | Tang et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |

(Continued)

FOREIGN PATENT DOCUMENTS

| | | |
|---|---|---|
| EP | 1238981 | 9/2002 |
| JP | 2010135467 | 6/2010 |

(Continued)

OTHER PUBLICATIONS

Chang et al., "Nano-particle based scattering layers for optical efficiency enhancement of organic light-emitting diodes and organic solar cells", 2013, Journal of Applied Physics 113: 204502.

(Continued)

*Primary Examiner* — Long K Tran
(74) *Attorney, Agent, or Firm* — Riverside Law LLP

(57) ABSTRACT

A flexible multilayer scattering substrate is disclosed. Built on a flexible supporting layer, the multilayer contains one or more scattering layers and other functional layers so that it can extract the trapped light in substrate and waveguide of an OLED. The processing of each layer is fully compatible with large area, flexible OLED manufactory, and by controlling processing conditions of each incorporated layer, the substrate microstructure can be tuned. Topographic features can be created on the top surface of substrate by changing the thickness and properties of the multilayer.

9 Claims, 8 Drawing Sheets

(56) References Cited

U.S. PATENT DOCUMENTS

| | | |
|---|---|---|
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 7,279,704 B2 | 10/2007 | Walters et al. |
| 7,431,968 B1 | 10/2008 | Shtein et al. |
| 7,579,054 B2 | 8/2009 | Akiyoshi et al. |
| 7,968,146 B2 | 6/2011 | Wanger et al. |
| 2003/0230980 A1 | 12/2003 | Forrest et al. |
| 2004/0174116 A1 | 9/2004 | Lu et al. |
| 2009/0311512 A1 | 12/2009 | Braun et al. |
| 2013/0026452 A1 | 1/2013 | Kottas et al. |
| 2013/0119354 A1 | 5/2013 | Ma et al. |
| 2013/0285088 A1 | 10/2013 | Xia et al. |
| 2014/0264316 A1 | 9/2014 | Setz et al. |
| 2014/0361270 A1 | 12/2014 | Cui et al. |

FOREIGN PATENT DOCUMENTS

| | | |
|---|---|---|
| WO | 2004111066 | 12/2004 |
| WO | 2008044723 | 4/2008 |
| WO | 2008057394 | 5/2008 |
| WO | 2010011390 | 1/2010 |
| WO | 2010111175 | 9/2010 |

OTHER PUBLICATIONS

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 1, 4-6 (1999).

FLEXIBLE MULTILAYER SCATTERING SUBSTRATE USED IN OLED

CROSS-REFERENCE TO RELATED APPLICATIONS

This application is a continuation of U.S. patent application Ser. No. 15/200,596, filed Jul. 1, 2016, which is a non-provisional of U.S. Patent Application Ser. No. 62/189,961, filed Jul. 8, 2015, both of which are incorporated herein by reference in their entireties.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to flexible multilayer scattering substrates, and devices, such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

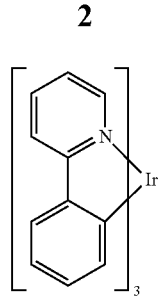

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

Due to the index mismatching at the interfaces of different index layers of an OLED, internal reflections occur, resulting in large part of light being trapped inside of the device. As the result, only 20% of generated light is outcoupled without any extracting method in a bottom emitting OLED. By incorporating a scattering layer, the emission angle is shifted and the internal reflection is reduced. The method belongs to the so called internal extraction structure (IES). One of the most important requirements of the IES is compatibility with lateral OLED fabrication. Specifically, the roughness of the top surface which contacts the OLED. For example, Hong-Wei Chang et al., demonstrated that by milling the scattering particles for 24 hours, fine top surface can be achieved without a further planarizing layer (Journal of Applied Physics 113, 204502, 2013). However, milling and the following filtering processes are not cost efficient. Most of the time, scattering alone cannot provide such fine roughness requirement, and a planarizing layer on top can flatten the surface. Regarding flexible OLED, another requirement is that the final substrate has to be a stand-alone film. Thus the scattering layer must not cause internal stress or crack under external stress. Due to the internal stress caused by the nanoparticles blended with polymer, the scattering layer alone usually fails to meet these criteria.

U.S. Pat. No. 7,579,054 discloses a flexible substrate comprising a resin composition layer containing an inorganic layered compound and a resin matrix. While it is a good example of the concept using an inorganic compound blended into a polymer matrix as a scattering layer and applied it to a flexible substrate, in terms of flexible applications, by using the scattering layer alone as the substrate, it is usually not satisfactory for OLED fabrication, even though the concept has been well studied and successfully applied on rigid substrates. On the other hand, U.S. Patent Application No. 20140264316 discloses an outcoupling system containing one or more scattering layers on top of a rigid substrate for OLED application. There is therefore a continuing need in the art for OLED multilayer substrates, and in particular flexible multilayer substrates for the next generation flexible display and light applications, wherein the flexible substrate is needed as the first supporting layer. There is also a continuing need in the art for addressing issues such as surface roughness, stress and processing conditions. The current invention fulfills these needs, by applying more functional layers with the same fabrication process, ensuring not only substrate flexibility, but bringing as well additional outcoupling features to the substrate.

SUMMARY OF THE INVENTION

In one aspect, the invention relates to a flexible, multi-layer substrate for an organic light emitting diode (OLED), comprising: a flexible support layer having a thickness of less than 50 µm; a light scattering layer disposed over the support layer, wherein the light scattering layer comprises light scattering particles dispersed in a polymer matrix; and a planarization layer disposed over the light scattering layer. In one embodiment, the flexible support layer has a thickness of less than 10 µm In another embodiment, the flexible support layer has a thickness of less than 5 µm. In one embodiment, the support layer is doped with a portion of the light scattering particles from the light scattering layer at an interface between the support layer and the light scattering layer. In another embodiment, the support layer is substantially free of light scattering particles from the light scattering layer at an interface between the support layer and the light scattering layer. In one embodiment, the support layer comprises at least one of PMMA, polyamide and PDMS. In another embodiment, the light scattering layer comprises a substantially uniform blend of scattering particles and polymer matrix. In one embodiment, the light scattering particle size is between 100 nm and 600 nm. In one embodiment, the scattering particles and polymer matrix are index mismatched. In one embodiment, the scattering particles comprise at least one of titanium oxide, zirconium oxide and zinc oxide. In one embodiment, the polymer matrix of the light scattering layer and the support layer are composed of the same polymer. In one embodiment, the loading ratio of the scattering particles is between 5% and 50%. In one embodiment, the thickness of the light scattering layer is between 0.1 and 10 µm. In another embodiment, the planarization layer comprises a plurality of layers. In one embodiment, the planarization layer and the support layer comprise the same material. In one embodiment, the planarization layer comprises at least one of silicon oxide, aluminum oxide, silicon nitride, indium zinc oxide, indium tin oxide and zinc aluminum oxide. In one embodiment, scattering centers of the light scattering layer have variable distributions over a normal direction of the flexible substrate. In one embodiment, the light scattering layer is positioned along a neutral plane of the multilayer substrate. In another embodiment, normal directional transmission of the substrates is between 10% and 60%. In one embodiment, the flexible substrate has a refractive index greater than 1.5. In one embodiment, the top surface of the planarization layer includes a topographic structure having a thickness of between 10 nm and 2 µm. In another embodiment, the thickness of the topographic structure is between 10 nm and 200 nm.

In another aspect, the invention relates to an OLED device, comprising at least one OLED stack disposed over the planarization layer of a flexible substrate of the invention.

In another aspect, the invention relates to a method of fabricating a flexible substrate for an organic light emitting diode (OLED), comprising: solution processing a support layer having a thickness of less than 50 µm on a rigid plate; curing the support layer; disposing a light scattering layer comprising light scattering particles dispersed in a polymer matrix on the support layer; curing the light scattering layer; disposing a planarization layer on top of the light scattering layer; and curing the planarization layer. In one embodiment, the method further comprises: curing the flexible substrate. In one embodiment, curing comprises soft baking. In another embodiment, curing comprises room temperature annealing. In one embodiment, curing the support layer and curing the light scattering layer creates a support layer substantially free of doped light scattering particles from the light scattering layer at an interface between the support layer and the light scattering layer. In another embodiment, curing the support layer and curing the light scattering layer creates a support layer doped with a portion of the light scattering particles from the light scattering layer at an interface between the support layer and the light scattering layer. In one embodiment, the rigid plate comprises at least one of glass, a silicon wafer, a metal plate, a sapphire plate and a plastic plate. In another embodiment, curing the flexible substrate comprises high temperature curing at over 150° C. for at least 1 hour. In one embodiment, all layers are processed with at least one of doctor blade coating and slot die coating. In one embodiment, the planarization layer is processed by at least one of plasma-enhanced chemical vapor deposition (PECVD), physical vapor deposition (PVD), and a vacuum method. In one embodiment, the method further comprises: peeling the flexible substrate off of the rigid plate.

In another aspect, the invention relates to a method of fabricating an OLED comprising a method of the invention for fabricating a flexible substrate of the invention further comprising: fabricating an OLED on top of the flexible substrate. In one embodiment, the method further comprises: fabricating an OLED on top of the flexible substrate; and peeling the flexible substrate off of the rigid plate.

DETAILED DESCRIPTION

Figure 1:
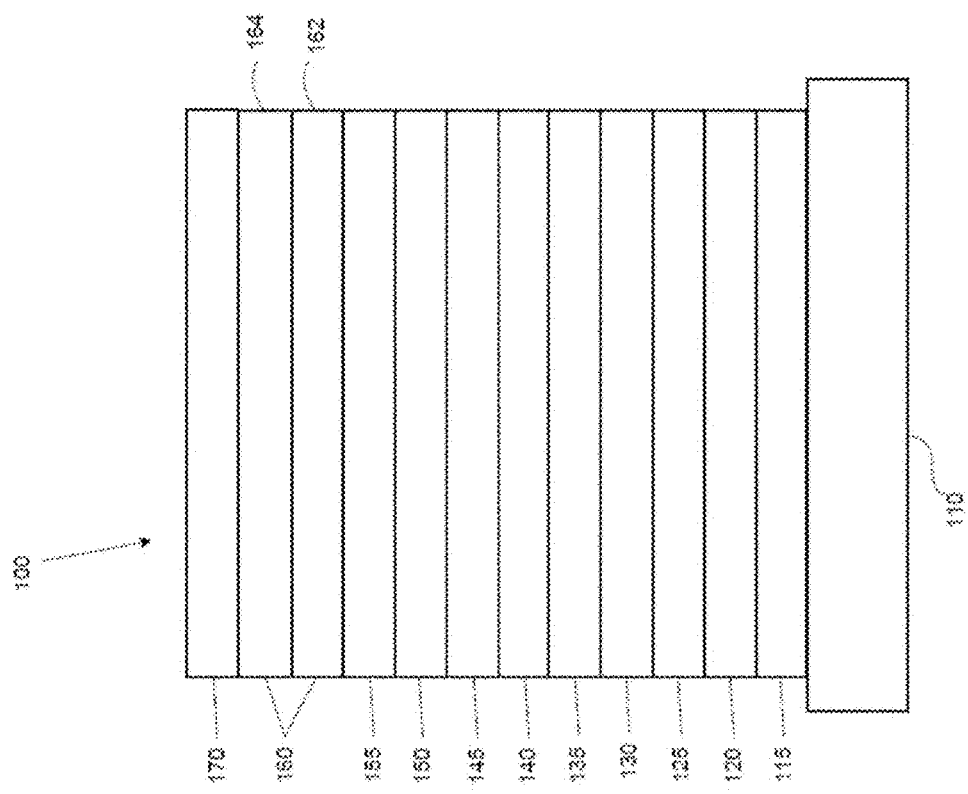
FIG. 1 shows an organic light emitting device.

It is to be understood that the figures and descriptions of the present invention have been simplified to illustrate elements that are relevant for a more clear comprehension of the present invention, while eliminating, for the purpose of clarity, many other elements found in systems and methods relating to scattering substrates and their application to OLED. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Ranges: throughout this disclosure, various aspects of the invention can be presented in a range format. It should be understood that the description in range format is merely for convenience and brevity and should not be construed as an inflexible limitation on the scope of the invention. Where appropriate, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
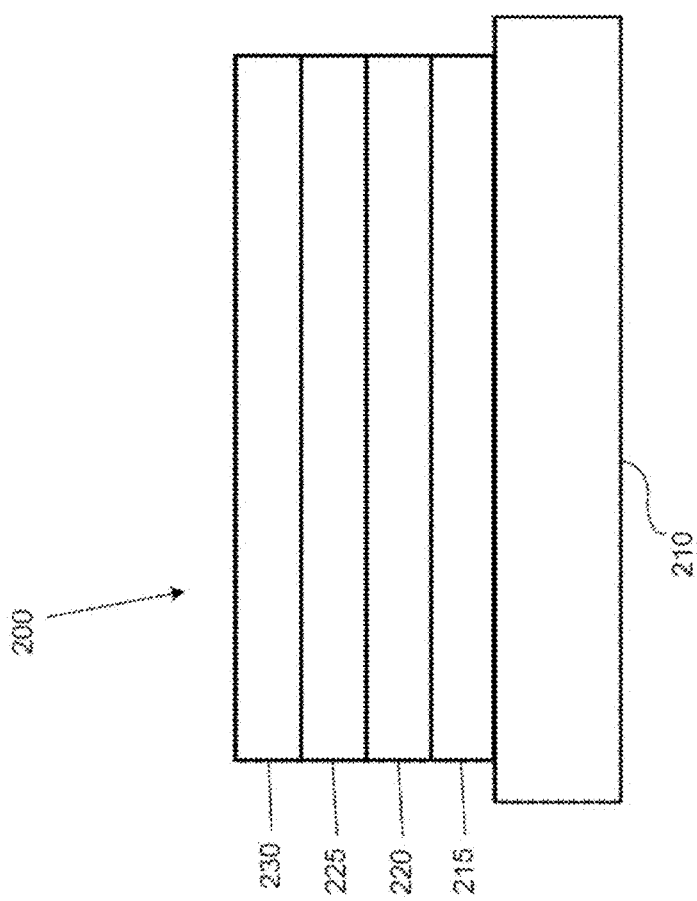
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18° C. to 30° C., and more preferably at room temperature, i.e., 20-25° C., but could be used outside this temperature range, for example, from −40° C. to +80° C.

Figure 3:
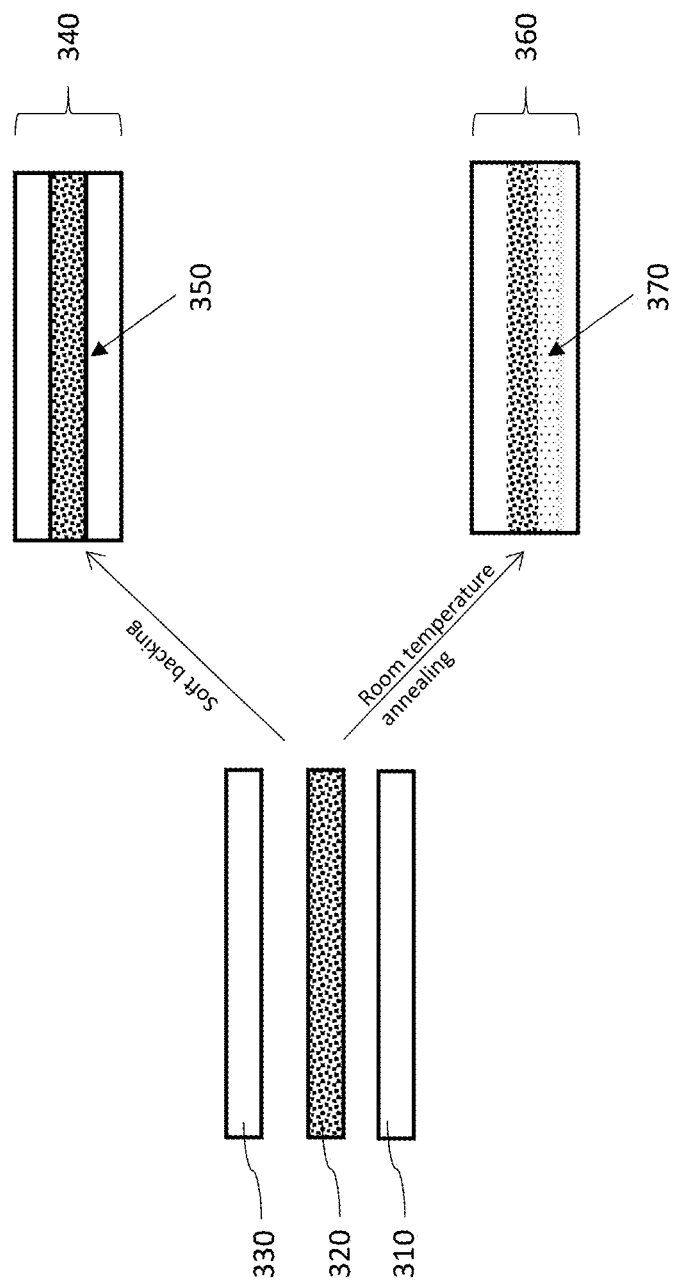
FIG. 3 is a schematic showing the elements of a flexible substrate, including a flexible support layer, a light scattering layer, and a planarization layer, and the resulting different microstructures of the final flexible substrate depending on different processing conditions.

In one aspect, the invention relates to a flexible multilayer scattering substrate for an organic light emitting diode (OLED). Referring to FIG. 3, in some embodiments 340 and 360, the flexible multilayer scattering substrate is a single unit containing at least three sub-layers: the first sub-layer 310 is a flexible supporting sub-layer having a thickness of less than 50 µm, the second sub-layer 320 disposed over the support sub-layer, is a light scattering sub-layer comprising light scattering particles dispersed in a polymer matrix, and the third sub-layer 330 is a planarization sub-layer disposed over the light scattering sub-layer. By sandwiching the light scattering sub-layer 320 between the flexible supporting sub-layer 310 and the planarization sub-layer 330, the scattering sub-layer 320 is therefore located at, or close to, the stress neutral plane, which helps improving the flexibility of the flexible multilayer scattering substrate.

Figure 4:
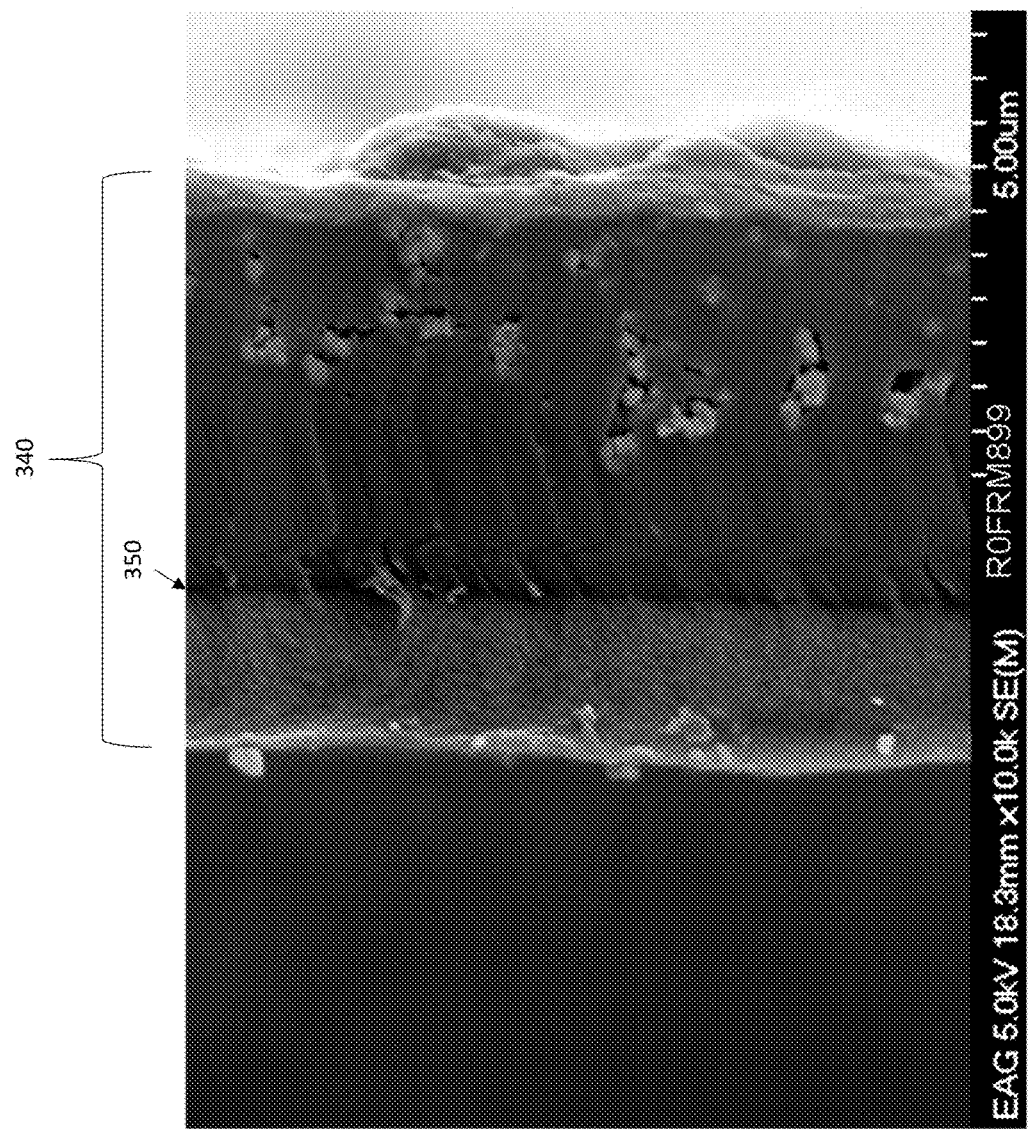
FIG. 4 shows a scanning electron microscopy (SEM) cross section image of a stand-alone flexible substrate containing a soft baked supporting layer and scattering layer, where a clean interface is observed between the layers.

Referring to FIGS. 3 and 4, owing to processing conditions described elsewhere herein including soft baking curing, in one embodiment 340, the flexible support sub-layer 310 is substantially free of light scattering particles from the light scattering sub-layer 320, at an interface 350 between the flexible support sub-layer 310 and the light scattering sub-layer 320.

Figure 5:
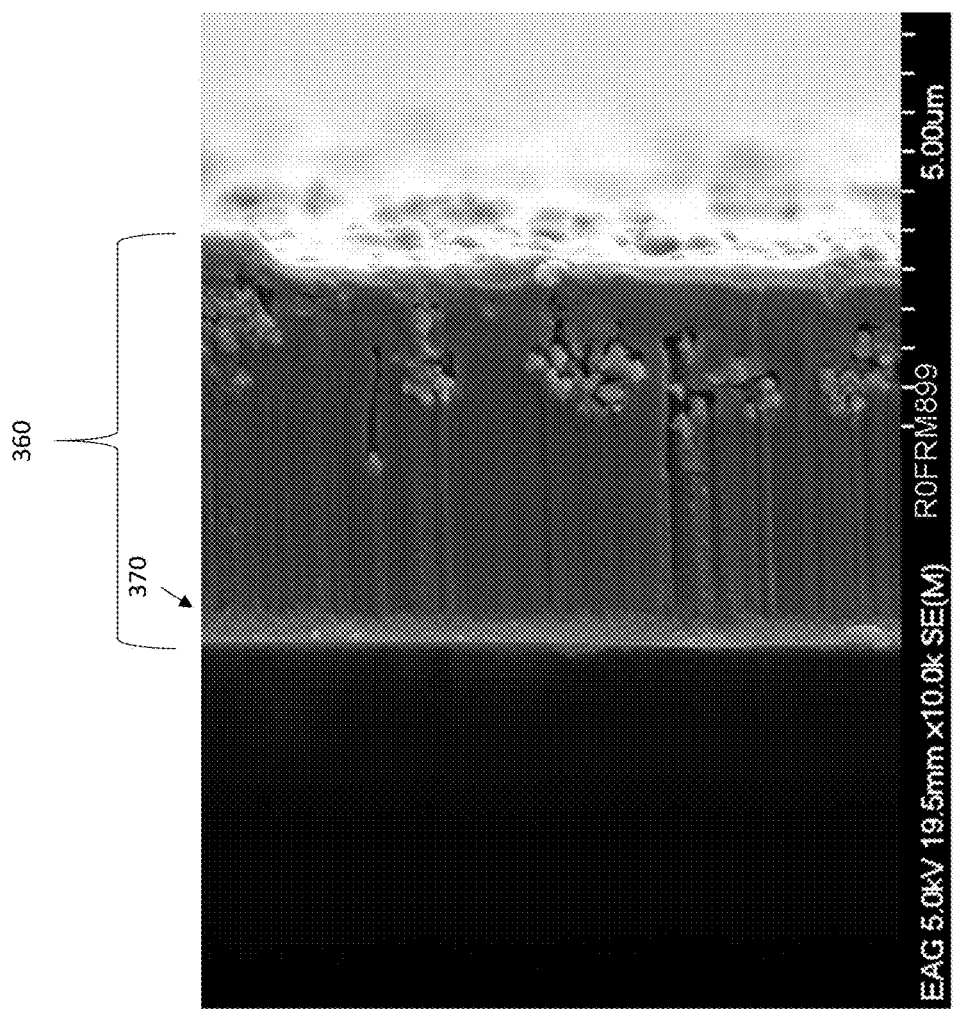
FIG. 5 shows an SEM cross section image of a stand-alone flexible substrate containing a room temperature baked supporting layer and scattering layer on top, where a well-mixed diffusion zone interface is observed between the layers, instead of a clean interface.

Referring to FIGS. 3 and 5, owing to processing conditions described elsewhere herein including room temperature annealing, in one embodiment 360, the flexible support sub-layer 310 is doped with a portion of the light scattering particles from the light scattering sub-layer 320 at a diffusion zone interface 370 between the flexible support sub-layer 310 and the light scattering sub-layer 320. A diffusion zone interface results in advantages such as lower internal stress of the flexible multilayer scattering substrate.

In some embodiments, the materials used in the first sub-layer 310 can be polymers such as PMMA, polyimide, or PDMS. In one embodiment, the thickness of the flexible support sub-layer is less than 2 µm. In other embodiments, the thickness is anywhere between 2 µm and Compared with other flexible substrates such as PEN, PET, or metal foil, the thicknesses of which are usually well over 50 µm, the thickness advantage ensures the flexibility of the final product. including the flexible multilayer scattering substrate or an OLED.

In some embodiments, the scattering sub-layer consists of blended scattering particles in a polymer matrix. In one embodiment, the scattering sub-layer requires a refractive index mismatch between the scattering particles and the polymer matrix. In another embodiment, the larger this mismatch is, the stronger the scattering will be. In one embodiment, the scattering particle size is between 100 to 600 nm. In another embodiment, the scattering particle material can be titanium oxide, zirconium oxide, or zinc oxide. In another embodiment, the matrix is the polymer used in the first supporting sub-layer. In another embodiment, the loading ratio (weight percentage of scattering particles over all solids) is between 5% and 50%. In another embodiment, the thickness of the scattering sub-layer is between 1 to 5 µm. In another embodiment, the thickness of the scattering sub-layer is between 0.1 to 10 µm. In another embodiment, the scattering centers have different distributions over the direction normal to the flexible multilayer scattering substrate. In another embodiment, by incorporating a scattering sub-layer, the normal directional light transmission of the flexible multilayer scattering substrate is between 10% and 60%.

In one embodiment, poly(methyl methacrylate) (PMMA) is used as polymer matrix of the scattering sub-layer, and 300 nm titanium oxide (TiOx) nanoparticles (NPs) as scattering particles. PMMA has a refractive index of 1.5 and TiOx has a refractive index of 2.2. In one embodiment, 1 g PMMA was dissolved into 10 ml dimethylacetamide (DMAc) as solution A. A second solution B was prepared, containing 0.45 g TiOx nanoparticles suspended into 9.5 ml DMAc, with 0.5 ml diethylene glycol monobutyl ether as surfactant. Solutions A and B were sonicated for 6 hours before they are mixed, another 6 hour sonication was performed, and the resulting composition was used to fabricate a scattering sub-layer. The resulting thin film scattering sub-layer has a loading ratio of 30%.

Figure 6:
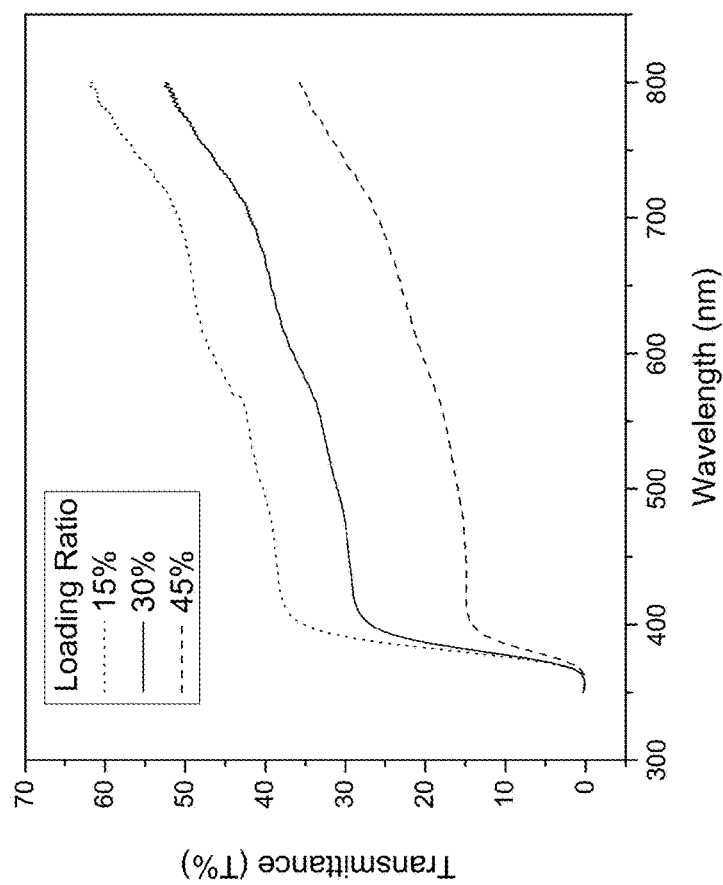
FIG. 6 is a chart showing the transmittance of flexible scattering substrates with different loading ratios.

Beside the refractive index difference, the scattering effect can be tuned also by varying the particle size, the loading ratio of particles over the total solid weight, and the thickness of the scattering layer. In some embodiments, the particle size is better close to scattering wavelength. Too small size cannot give any scattering, while too large size will affect the film quality in terms of internal stress and smoothness. In some embodiments, a suitable range is between 100 nm to 600 nm. For a given scattering layer thickness, the higher the NPs loading ratio, the more scattering is observed, therefore lowering the transmittance of the film. FIG. 6 shows the transmittance of a flexible multilayer scattering substrate of 7.5 µm total thickness, including a 1.25 µm thick scattering sub-layer sandwiched between the flexible supporting sub-layer and the planarization sub-layer, at various scattering particles loading ratios. The 300 nm NPs (30% loading ratio) afford a good scattering spectrum, where a relative flat transmission covers the visible range. For 550 nm incident light, a 32% transmittance is observed. FIG. 6 also shows the transmission of other loading ratio with 300 nm TiOx in PMMA. Too high loading ratio is not desired because of the resulting high internal stress caused by NPs' aggregation. In some embodiments, a loading ratio range from 5% to 50% is generally good for scattering and film quality. The consideration of scattering sub-layer thickness lays on the overall stress and flexibility of the flexible multilayer scattering substrate. A thick scattering sub-layer results in large stress mismatch in the whole stack.

In some embodiments, the planarization sub-layer contains one or more sub-layers. In another embodiment, the material used for the planarization sub-layer is the same as the first flexible supporting sub-layer, or can be an inorganic material such as silicon oxide, aluminum oxide, silicon nitride, indium zinc oxide, indium tin oxide, or zinc aluminum oxide. In another embodiment, the index of the substrate contacting OLED is larger than 1.5.

In some embodiments, a topographic structure can be created on top of the flexible multilayer scattering substrate, depending on the thickness of the planarization sub-layer and the composition of the scattering sub-layer. In one embodiment, the final topographic structure has feature size between 100 nm to 2 µm. In another embodiment, the final topographic structure has feature peak to valley between 10 nm to 200 nm.

Figure 7:
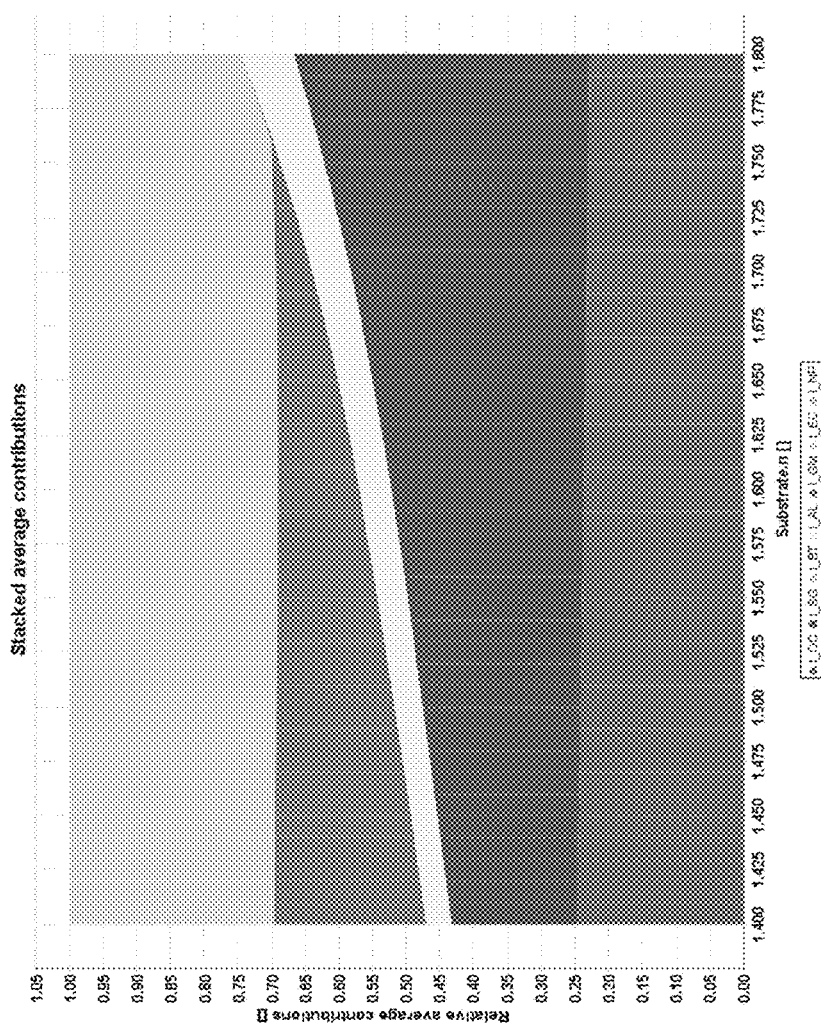
FIG. 7 is a chart showing the relation between index change vs. the optical modes distribution of a bottom emission OLED (simulation).

In some embodiments, the matrix polymer used is an optically clear material. The index of the matrix affects the overall outcoupling enhancement. FIG. 7 shows a simulation of light distribution versus the index of the substrate. The outcoupled (I_OC) mode indicates light emitted out of the device without any extracting method. Under this condition, only 25% of generated light is in I_OC mode. Total internal reflection occurs at the interface of substrate and air, holding 20% of the light in the substrate (I_SG mode). Another 20% of that light is trapped in the waveguided (I_GM) mode, due to the higher index of ITO and organic materials than that of the substrate. About 30% of the light is eventually evanescent (I_EC mode) through the surface plasmon loss at the interface of the organic layer and the metal electrode. Another small part of light is absorbed by the organic material and metal (I_AL). With the index of substrate approaching to ITO/organic, more and more light is converted into I_SG mode. The light in I_SG mode is then potentially outcoupled by scattering.

In some embodiments, the surface of the flexible multilayer scattering substrate can be tuned by varying the thickness of the planarization sub-layer. A typical surface of the scattering sub-layer is too rough to support OLED growth. Table 1 shows the root mean square (R.M.S) surface roughness of a scattering sub-layer including 300 nm NPs blended with polymer as measured by atomic-force microscopy (AFM). With the largest peak to valley at over 200 nm, the R.M.S. is 58.6 nm. With an increasing in the thicknesses of the planarization layer, the roughness of the surface decreases. With the thickness up to 5 µm, the surface topographic feature disappears, showing a smooth surface with 8.4 nm roughness. Therefore various surface morphologies can be obtained by changing the thickness of the planarization sub-layer. For example, a peak to valley roughness of 100 nm is obtained with the planarization layer thickness of 2 µm. In some embodiments, under this condition, an OLED can be fabricated on top of this rough surface so that the topographic feature can be utilized for outcoupling.

TABLE 1 roughness of flexible substrate with planarization layer

| Planarization Thickness (µm) | 0 | 1.0 | 2.2 | 4.7 |
|---|---|---|---|---|
| R.M.S. Roughness (nm) | 58.6 | 12.8 | 14.3 | 8.4 |

Figure 8:
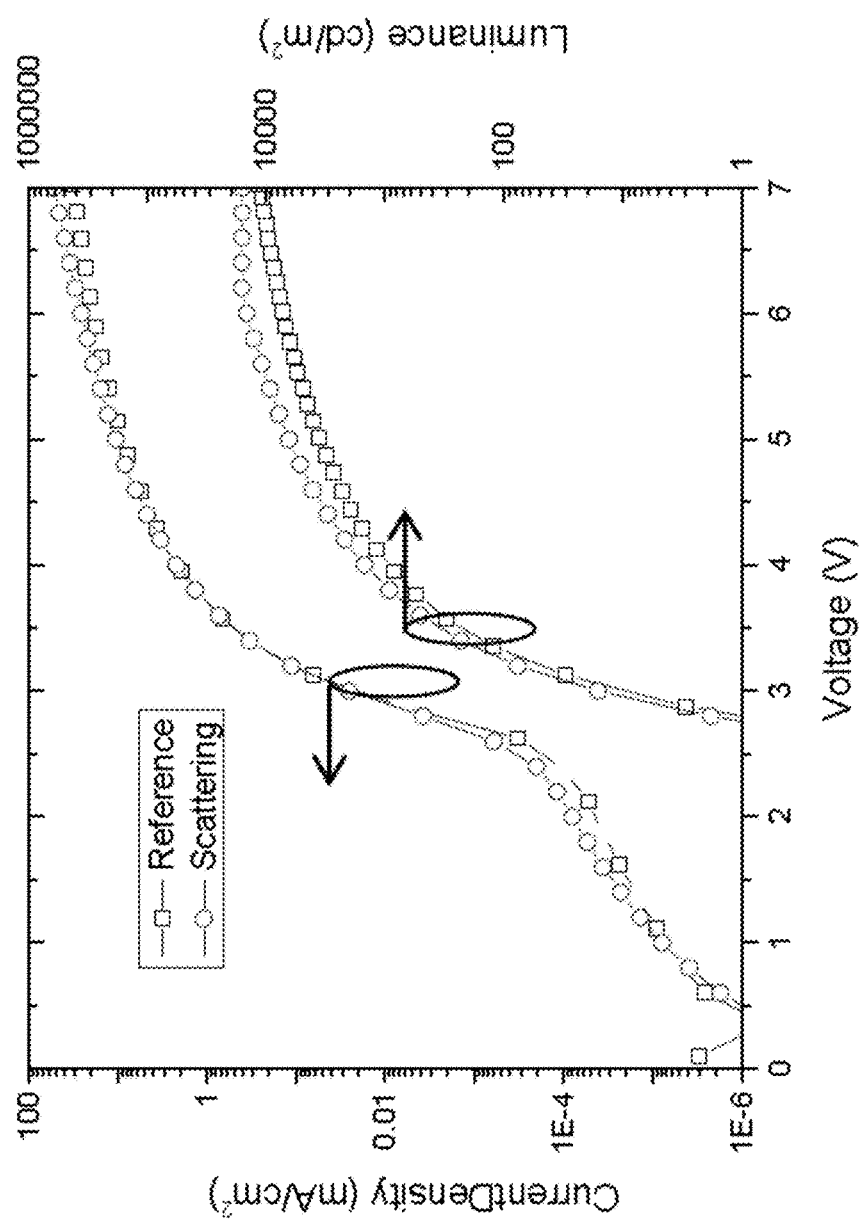
FIG. 8 is a chart showing current-voltage-luminance plots.

In one aspect, the invention relates to an OLED. In some embodiments, the OLED is fabricated on top of a flexible multilayer scattering substrate of the invention. In one embodiment, the OLED is a bottom emission OLED. In another embodiment, the OLED is a top emission OLED. In one embodiment, an OLED was fabricated on the flexible multilayer scattering substrate. The substrate has a total thickness of 7.5 µm with a 1.25 µm thick scattering sub-layer sandwiched between the flexible supporting sub-layer and the planarization sub-layer. The substrate shows a 32% transmittance at 550 nm incident light, and a roughness of 2.3 nm of the top surface. An OLED without the scattering sub-layer was also fabricated for comparison purposes. The reference substrate only has the supporting sub-layer and planarization sub-layer. The transmittance at 550 nm incident light is 86%, and the roughness is 0.3 nm. Due to the smooth surface afforded by the planarization sub-layer, the two devices give nearly the same current-voltage curve as shown in FIG. 8. In terms of efficiency, the reference device has a current efficiency of 44 cd/A at 1000 nits. By including a scattering sub-layer, the efficiency increased to 67 cd/A. Due to the broad scattering over the visible range, there is no significant derivation of the scattering device emission spectrum compared to the reference device.

In one aspect, the invention relates to a process of fabricating a flexible multilayer scattering substrate. In one embodiment, the process starts with solution processing the first supporting sub-layer on a rigid plate. In one embodiment, the rigid plate could be glass, silicon wafer, metal plate, sapphire plate, plastic plate. In another embodiment, the resulting interface between each sub-layer depends on the annealing or curing process after deposition. In another embodiment, a soft baking quickly cures the preceding film and creates a clear interface with the subsequent film. In another embodiment, a slow curing process takes place under room temperature annealing, which results in blurring of interface between sub-layers, and doping of the underneath preceding sub-layer. In another embodiment, the final step for the entire flexible multilayer scattering substrate is a high temperature curing at 150° C. over 1 hour. In another embodiment, all sub-layers can be processed by doctor blade coating, slow die coating, and any other large area coating methods of solution processing known in the art. In another embodiment, the planarization sub-layer(s) can also be done by PECVD, PVD, and any other vacuum coating methods known in the art. In another embodiment, the process of fabricating flexible multilayer scattering substrates of the invention ends up with peeling off the whole flexible film from the rigid plate.

In some embodiments, a process of the invention starts with coating the first supporting flexible sub-layer on a rigid plate, and ends with peeling the whole flexible multilayer scattering substrate off the rigid plate. The flexible supporting sub-layer serves the purpose of flexible base for the following scattering sub-layer. It also provides a good contact surface with the underneath rigid plate so that a large area uniform coating can be achieved. The materials of this sub-layer are plastic which can be cast from liquid state, such as PMMA, polyimide, PDMS, or any type of resin known in the art. Then a scattering sub-layer is coated as an outcoupling sub-layer. In some embodiments, the scattering sub-layer covers the full area of the supporting sub-layer. In other embodiments, one or more planarization sub-layers are thereafter deposited. In some embodiments, after deposition and treatments of all sub-layers, the whole flexible multilayer substrate stack goes through final annealing. In one embodiment, final annealing is performed at, or at more than, 150° C. In another embodiment, final annealing is performed for, or for more than, an hour. In other embodiments, the temperature used for final annealing is higher than the crosslink or thermal set temperature of the matrix materials. In other embodiments, the final step is to release the flexible multilayer substrate from the rigid plate.

In one embodiment, the annealing of each sub-layer affects the microstructure of the flexible multilayer substrate. In one embodiment, the annealing affects the scattering center density distribution over the normal direction of the film. In one embodiment, soft baking, e.g., at 90° C. for 3 min, is applied to each sub-layer after coating, as shown for example in FIG. 3 (top arrow process). Soft baking quickly drives out all solvent and solidifies the film, and as a result, the microstructure of each sub-layer is substantially preserved. Referring now to FIG. 4, the SEM cross section image of a stand-alone flexible multilayer film containing soft baked supporting sub-layer and scattering sub-layer, reveals a clear interface 350. The scattering centers are confined in the scattering sub-layer due to the fast drying process.

In other embodiments, each sub-layer goes under room temperature annealing after deposition, as shown for example in FIG. 3 (bottom arrow process). The curing time is longer than the soft baking. In some embodiments, the curing time is about 5 to 10 min longer, depending on the thickness of the sub-layer. During the slow solvent evaporation process, there is therefore time for the two sub-layers to penetrate or diffuse into each other. Referring now to FIG. 5, the SEM cross section image of a stand-alone flexible multilayer film containing room temperature baked supporting sub-layer and scattering sub-layer on top, no clear interface can be observed, but rather a diffusion zone 370 can be observed. When the scattering center blending sub-layer penetrates into other sub-layers, a self-doping takes place. As readily apparent, particles located in the supporting sub-layer illustrate the result of the doping process. The penetration depth and doping concentration are depending on the annealing process and the materials of the solvent, matrix, and blending scattering particles. The self-doping process advantageously reduces internal stress.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention.

We claim:

1. A method of fabricating a flexible substrate for an organic light emitting diode (OLED), comprising:
    solution processing a support layer having a thickness of less than 50 µm on a rigid plate;
    curing the support layer;
    disposing a light scattering layer comprising light scattering particles dispersed in a polymer matrix on the support layer;
    curing the light scattering layer;
    disposing a planarization layer on top of the light scattering layer; and curing the planarization layer; wherein
    curing the support layer and curing the light scattering layer creates a support layer doped with a portion of the light scattering particles from the light scattering layer at an interface between the support layer and the light scattering layer.

2. The method of claim 1, further comprising:
    curing the flexible substrate.

3. The method of claim 1, wherein curing comprises soft baking.

4. The method of claim 1, wherein curing comprises room temperature annealing.

5. The method of claim 1, wherein curing the support layer and curing the light scattering layer creates a support layer substantially free of doped light scattering particles from the light scattering layer at an interface between the support layer and the light scattering layer.

6. The method of claim 1, wherein curing the flexible substrate comprises high temperature curing at over 150° C. for at least 1 hour.

7. The method of claim 1, wherein all layers are processed with at least one of doctor blade coating and slot die coating.

8. The method of claim 1, wherein the planarization layer is processed by at least one of plasma-enhanced chemical vapor deposition (PECVD), physical vapor deposition (PVD), and a vacuum method.

9. A method of fabricating an OLED comprising the method of claim 1 further comprising:
    fabricating an OLED on top of the flexible substrate.

* * * * *